(12) United States Patent
Ghanadan et al.

(10) Patent No.: US 6,259,319 B1
(45) Date of Patent: Jul. 10, 2001

(54) ADAPTIVE GAIN AND/OR PHASE ADJUSTMENT CONTROL SYSTEM AND METHOD

(75) Inventors: Reza Ghanadan, Berkeley Heights; Robert Evan Myer, Denville, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/377,387

(22) Filed: Aug. 19, 1999

(51) Int. Cl.$^7$ ............................. H03F 1/26; H03F 1/00; H03F 3/66; H04K 1/02
(52) U.S. Cl. ..................... 330/149; 330/151; 330/52; 375/296
(58) Field of Search .......................... 330/52, 149, 151; 375/296, 297

(56) References Cited

U.S. PATENT DOCUMENTS

| | | | | |
|---|---|---|---|---|
| 4,580,105 | * | 4/1986 | Myer | 330/149 |
| 4,885,551 | * | 12/1989 | Myer | 330/52 |
| 5,023,565 | * | 6/1991 | Lieu | 330/151 |
| 5,706,057 | * | 1/1998 | Strolle et al. | 348/426 |
| 6,028,477 | * | 2/2000 | Gentzler | 330/149 |

* cited by examiner

Primary Examiner—Robert Pascal
Assistant Examiner—Patricia Nguyen
(74) Attorney, Agent, or Firm—Allen, Dyer, Doppelt, Milbrath & Gilchrist, P.A.

(57) ABSTRACT

An adaptive gain and/or phase control system adapts the gain and/or phase adjustment resolution to provide improved performance. For example, the adaptive gain and/or phase control system can dynamically adjust the adjustment resolution for gain and/or phase adjustments as a function of the error signal(s). In response to a large error signal(s) (far from the null), the adaptive gain/or phase control system decreases the adjustment resolution, resulting in a faster convergence rate. In a feed forward distortion reduction system, decreasing the adjustment resolution improves the transient response of the amplifier (for example, given any set of operating conditions, how quickly the amplifier responds to a changing input). As phase or gain adjustments are made to approach the null, the error signal reduces, and the adaptive distortion reduction system increases the adjustment resolution. By increasing the adjustment resolution as the error signal approaches the null, finer phase or gain adjustments can be made which further reduce the error signal. For example, in a feed forward distortion reduction system, such a scheme prevents the error signal from repeatedly jumping over the null due to limited resolution without sacrificing the transient response of the amplifier.

19 Claims, 6 Drawing Sheets

CANCELLATION ERROR

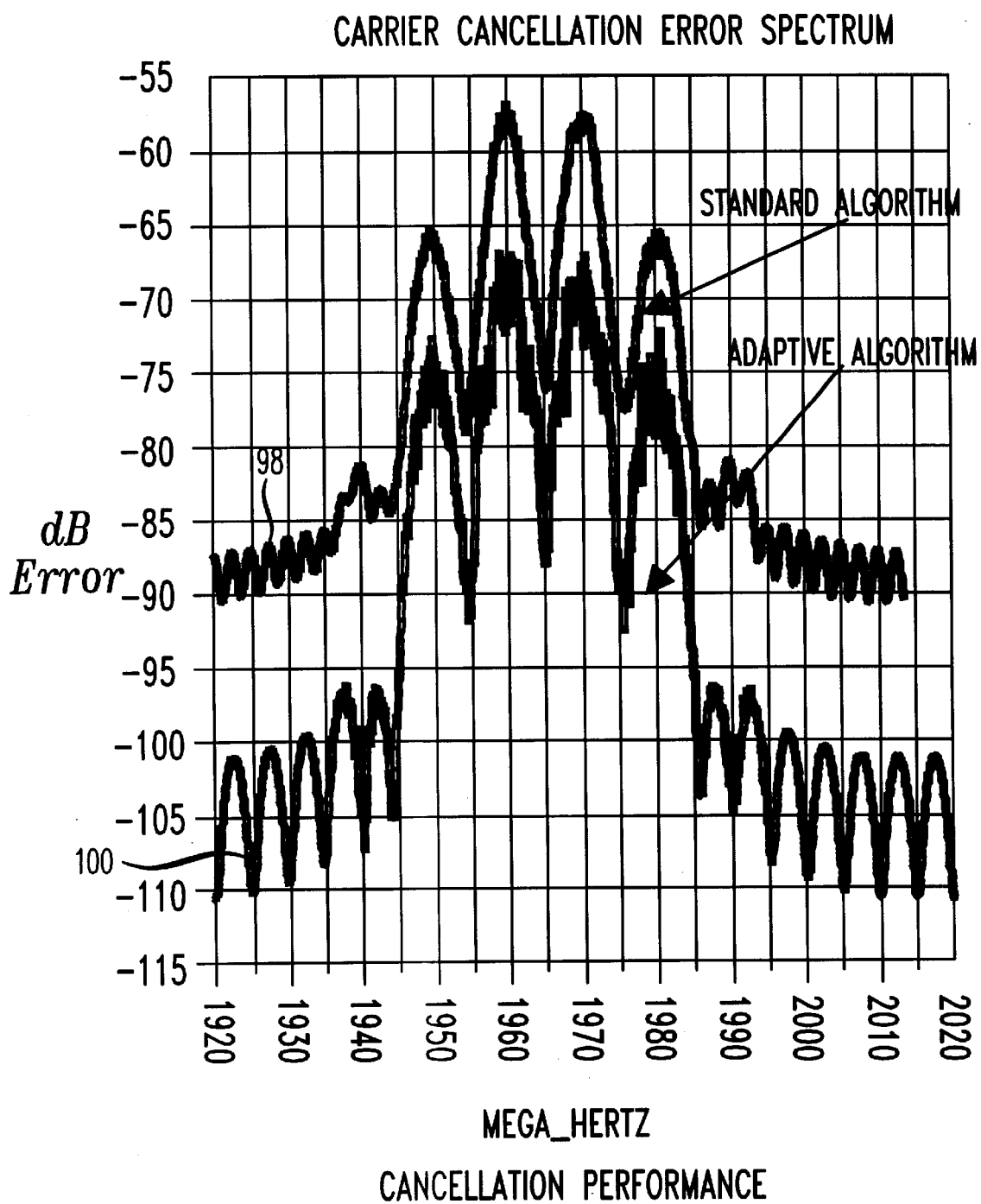

ADAPTIVE GAIN AND/OR PHASE ADJUSTMENT CONTROL SYSTEM AND METHOD

BACKGROUND OF THE INVENTION

1. Field of The Invention

This invention relates to a gain and/or phase adjustment control system to adjust the relative phase and/or gain between combining signals for example in a distortion reduction system.

2. Description of Related Art

Amplifiers often add undesired distortion to a signal, creating an output signal comprising distortion or nonlinear components and the signal component. The distortion includes any undesired signals added to or affecting adversely the input signal. There is therefore a need to devise techniques that can eliminate substantially or reduce significantly the distortion produced by the amplifier.

Feed-forward correction is routinely deployed in modern amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of input RF carrier pattern as well as the resultant distortion location, a known frequency component, i.e. a pilot signal, is injected in the main signal path with the distortion produced by the amplification process. In feed-forward amplifiers, the feed forward distortion reduction circuitry minimizes the pilot signal along with the distortion. As such, by designing the feed forward distortion reduction circuitry to detect and cancel the pilot signal, the distortion can also be removed.

The pilot signal is an electrical signal comprising at least one frequency component spectrally located near the frequency band of operation of the electrical circuit. A more complete description of the pilot signal is shown in FIG. 1 which shows the frequency response of a radio frequency (RF) amplifier including the location of the pilot signal. The pilot signal can be near the lower edge of the operating band (e.g., pilot 1) and/or located near the upper edge of the band of operation (e.g., pilot 2). The pilot is positioned a spectral distance of $\Delta f$ from an edge of the band of operation whose center frequency is $f_0$. The electrical characteristics (e.g., amplitude, phase response, spectral content) of the pilot signal are known. It should be noted that although the pilot signal is shown as having one or two spectral components of a certain amplitude, the pilot signal can comprise a plurality of spectral components having various amplitudes.

The feed forward distortion reduction circuitry reduces distortion produced by the RF amplifier by applying the pilot signal to the RF amplifier and making adjustments based on information obtained from the applied pilot signal. FIG. 2 discloses feed-forward correction circuitry 10 and its use of information obtained from the pilot signal to reduce distortion produced by RF amplifier 12. An input signal, for example including at least one carrier signal, is applied to a splitter 14. The splitter 14 replicates the input signal on a main signal path 16 and a feed forward path 18. The splitter 14 is part of a carrier cancellation loop referred to as loop #1, which in addition to the splitter 14, comprises gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to interfere with the operation of the amplifier 12. The output of the coupler 22 is applied to the amplifier 12 whose output comprises the amplified input signal, the amplified pilot signal and distortion signals produced by the amplifier 12.

A portion of the output of the amplifier 12 is obtained from the coupler 26 and is combined at the coupler 28 via coupling path 30 with a delayed version of the input signal on the feed forward path 18 to isolate the pilot signal with distortion on the feed forward path 18. The input signal on the feed forward path 18 is sufficiently delayed by delay circuit 24 so that such signal experiences the same delay as the signal appearing at the coupler 28 via the path 30. The resulting error signal contains the distortion produced by the amplifier 12 along with any portion of the carrier signal remaining at the output of the coupler 28 and the pilot signal. The amount of carrier cancellation in the carrier cancellation loop depends on the proper gain and phase match between the two paths from the splitter 14 to the coupler 28.

The gain & phase circuit 20 adjusts the phase and gain of the input signal according to control signals on control paths 32 and 34 such that the signal appearing at the coupler 28 via the path 30 is substantially the inverse (equal in amplitude but 180° out of phase) of the delayed input signal at the coupler 28. The gain and phase control signals appearing on the control paths 32 and 34 of the gain & phase circuit 20 are derived from the signal at the output of the coupler 28 in a well known manner using signal detection and control circuitry 35. In general, the signal detection and control circuitry 35 detects an error signal for the carrier cancellation loop. The error signal represents the amplitude of the signal at point A, and the signal detection and control circuitry 35 attempts to reduce the amplitude of the error signal by providing gain and/or phase control signals.

In this embodiment, the signal detection and control circuitry 35 includes a detector 36, such as a log detector, which produces a signal representing the amplitude of the signal at point A. A filter 38 filters the output of the log detector to produce a DC-type amplitude signal representing the amplitude of the error signal. The amplitude signal is provided to a nulling circuit 40. In response to the amplitude signal, the nulling circuit 40 provides the control signals on the control paths 32 and 34 to adjust the relative gain and/or phase between the combining signals at the coupler 28 and reduce the error signal, thereby reducing the carrier signal (s). When the error signal is minimized, the carrier signals combined at the coupler 28 substantially cancel each other leaving at the output of the coupler 28 the pilot signal with distortion produced by the amplifier 12. Loop #1 is thus a carrier cancellation loop which serves to isolate on the feed forward path 18 the pilot signal with distortion produced by the amplifier 12.

A distortion reduction loop or loop #2 attempts to reduce the pilot signal on the main signal path 16, thereby reducing the distortion produced by the amplifier 12, using the error signal at the output of the coupler 28. The pilot signal with distortion on the feed forward path 18 is fed to a gain & phase circuit 42. The output of the gain and phase circuit 42 is fed to amplifier 44 whose output is applied to coupler 46. The coupler 46 combines the amplified pilot signal and distortion on the feed forward path 18 with the signals from the amplifier 12 on the main signal path 16 (carrier signal(s), pilot signal with distortion). A delay circuit 40 on the main signal path 16 delays the signals from the output of the amplifier 12 on the main signal path 16 to experience substantially the same delay as the corresponding signals from the output of the amplifier 12 which pass over the coupling path 30 through the coupler 28 to the coupler 46.

A coupler 48 provides an error signal representative of the signal at the output of the coupler 46 onto a pilot detection path 50. Because the frequency, amplitude and other electrical characteristics of the pilot signal are known, pilot detection and control circuitry 52 can detect the amplitude of the remaining portion of the pilot signal from the error signal on the pilot detection path 50. The pilot detection and control circuitry 52 determines the amplitude of the pilot signal, and in response to the amplitude of the remaining pilot signal, the pilot detection and control circuitry 52 provides control signals to the phase and gain circuit 42. In general, the pilot detection and control circuitry 52 will detect the pilot signal and use this information to generate control signals onto paths 66 and 68 to cause the gain & phase circuit 42 to adjust the gain and/or phase of the pilot signal on the feed forward path 18 such that the pilot signal on the main path 16 as well as the distortion is substantially the inverse (equal in amplitude but 180° out of phase) of the pilot signal and the distortion on the feed forward path 18 at the coupler 46. The corresponding pilot signals and distortion substantially cancel each other at the coupler 46 leaving the carrier signal(s) at the output of the system. Therefore, loop #2 is a distortion reduction loop which attempts to cancel the pilot signal to cancel substantially the distortion produced by the amplifier 12.

In this embodiment, the pilot detection and control circuitry 52 includes pilot receive circuitry 54 which includes a mixer 56 to frequency convert the error signal on the pilot detection path 52 to lower frequencies and a filter 58 to facilitate detection of the pilot signal by a signal detector 60. The detector 60, such as a log detector, produces a signal representing the amplitude of the signal at point B. A filter 62 filters the output of the detector 60 to produce a DC-type amplitude signal representing the amplitude of the remaining pilot signal. The amplitude signal is provided to a nulling circuit 64. In response to the amplitude signal, the nulling circuit 64 provides gain and phase control signals on the control paths 66 and 68 to the phase and gain circuit 42. The control signals are provided to adjust the relative gain and/or phase between the signals being combined at the coupler 46 and reduce the amplitude signal, thereby reducing the remaining pilot signal. The amount of cancellation of the pilot signal indicates the amount of distortion cancellation. When amplitude of the pilot signal is minimized, the pilot signals and distortion combined at the coupler 46 substantially cancel each other at the output of the coupler 46.

In actual systems, however, there is rarely an absolute cancellation of the combining signals. The amount of signal cancellation depends on the proper gain and phase match between the combining signals. Signal reduction as a function of gain and phase mismatch is shown in FIG. 3. The gain and phase characteristics of the amplifiers 12 and 44 as well as of the other devices vary over time. Such variations are typically due to the temperature, input power, device age and manufacturing variations. To maintain carrier cancellation performance in the carrier cancellation loop and distortion reduction in the distortion reduction loop, the signal detection and control circuitry 35 and the pilot detection and control circuitry 52 are designed to automatically control the gain and phase characteristics for the corresponding carrier cancellation and distortion reduction loops based on the amplitudes of the corresponding error signals. The nulling circuits 40 and 64 attempt to reduce the error signal (indicating improved cancellation) by comparing every error signal sample with a previous error signal sample. In response to the comparison, the nulling circuit 40 or 64 provides control signals to make phase and/or gain adjustments. Depending on the embodiment, nulling circuits can be used to control phase and/or gain. Since the detect and control circuitry 35 and 52 make both gain and phase adjustments but only one detector is shown for each, the nulling circuits 40 and 64 repeatedly make a series of gain adjustments followed by a series of phase adjustments.

The performance of the nulling circuitry 40 or 64 can be measured by two parameters: error cancellation related to the amount of cancellation which can be achieved and the rate of convergence relates to the speed in which a null is found. The phase and gain adjustment control voltage change from the nulling circuits 40 or 64 is determined by multiplying a step size or time constant (for example 0.01–0.05) with magnitude of the error signal. For example, the phase and gain control voltage can change based on the equation $\Delta V_{out}(n+1) = -K(n+1) * |error(n)| * sign(error(n) - error(n-1)) * sign(\Delta V_{out}(n))$. As such, if the sign of error (n)–error(n–1) is positive (meaning the previous adjustment resulted in an increase in the error signal), then the negative sign in front of the equation flips the sign of the adjustment $\Delta V_{out}(n+1)$ as compared to the sign of the previous voltage change $\Delta V_{out}(n)$. If the sign of error(n)–error(n–1) is negative (meaning an improvement in the error signal), the negative sign in front of the equation maintains the sign of the previous adjustment $\Delta V_{out}(n)$ which resulted in the improvement.

When the feed forward correction circuitry 10 is being tuned, the step size is set to establish an adjustment resolution which provides adequate error signal cancellation at an adequate convergence rate. Afterward, the step-size or adjustment resolution remains fixed. Because the nulling circuits use a fixed time constant, there is a traded between the minimum error signal achievable and the speed of achieving the minimum error signal. If a fixed step-size is used, the error signal cannot be reduced below a certain fixed magnitude. When the error signal approaches the minimum, the step size becomes so coarse when compared to the error signal that the step-size becomes a limit on the amount that the error signal can be reduced. This constraint is due to the higher sensitivity of the magnitude of the error signal to gain and phase adjustments close to the null. When the error signal is large, the same step size can inhibit the rate of convergence. Additionally, if the step-size or adjustment resolution is too small and when the gain and phase adjustments are away from the null (or error signal is large), detection of whether gain or phase adjustments are improving the error signal cannot be accurately performed, resulting in incorrect decisions or adjustments.

In the embodiment of FIG. 2, the linear output range of the log detector 36 or 60 is 600 mV–2 volts. As such, the error signal has a magnitude which is offset by the 600 mV limitation of the log detector 36 or 60. After filtering, the log detector 36 or 60 outputs the error signal to the nulling circuit 40 or 64. The nulling circuit 40 or 64 is initially tuned to establish a fixed step size from 0.01 to 0.05. To determine the adjustment control signal, for example an adjustment voltage, the nulling circuit 40 or 64 multiplies the fixed step size or adjustment resolution by the magnitude of the error signal. In this embodiment, the gain and phase adjusters 20 and 42 can handle control signals on the paths 32 and 34 in the range of 6 mV–100 mV with each 1 volt change producing a 15 degree phase change by the phase adjustor and a 1 dB change in the gain by the gain adjuster. Such a control voltage change provides a 0.09 to 1.5 degree phase adjustment and a 0.006 dB to 0.1 dB gain adjustment.

However, if the step size is fixed, the dynamic range of the nulling circuit 40 or 64 and accordingly of the gain and phase adjusters is limited. For example, if the step size is fixed at 0.03, the nulling circuit 40 or 64 produces a dynamic range for a gain and/or phase adjustment value of 18 mV to 60 mV. Therefore, the resulting dynamic range of the gain and phase adjusters 20 and 42 is limited to a 0.27 to 0.9 degree phase adjustment or a 0.018 dB to 0.06 dB gain adjustment for a single adjustment value. Dynamic range limits both steady state error cancellation and speed at which steady state error cancellation is achieved.

The nulling sensitivity and the location of the null varies as system parameters and transmit power varies. For example, in multi-user wireless communications systems, such as Code division multiple access (CDMA), Time division multiple access (TDMA), Global System for Mobile Communications (GSM) and orthogonal frequency division multiplexing (OFDM), multiple voice and/or traffic channels are combined into a single or multiple carriers. A linear amplifier should be able to react rapidly to transmit power changes and bursty traffic variations within the transient response specifications in the microsecond and millisecond ranges while providing adequate error cancellation.

SUMMARY OF THE INVENTION

The present invention involves an adaptive gain and/or phase control system which adapts the gain and/or phase adjustment resolution to provide improved performance. For example, the adaptive gain and/or phase control system can dynamically adjust the adjustment resolution for gain and/or phase adjustments as a function of the error signal(s). In response to a large error signal(s) (far from the null), the adaptive gain/or phase control system decreases the adjustment resolution, resulting in a faster convergence rate. In a feed forward distortion reduction system, decreasing the adjustment resolution improves the transient response of the amplifier (for example, given any set of operating conditions, how quickly the amplifier responds to a changing input). As phase or gain adjustments are made to approach the null, the error signal reduces, and the adaptive distortion reduction system increases the adjustment resolution. By increasing the adjustment resolution as the error signal approaches the null, finer phase or gain adjustments can be made which further reduce the error signal. For example, in a feed forward distortion reduction system, such a scheme prevents the error signal from repeatedly jumping over the null due to limited resolution without sacrificing the transient response of the amplifier.

BRIEF DESCRIPTION OF THE DRAWINGS

Other aspects and advantages of the present invention may become apparent upon reading the following detailed description and upon reference to the drawings in which:

FIGS. 5a and 5b show cancellation and convergence rate performance for the adaptive gain and/or gain control system according to the principles of the present invention compared to the standard fixed step-size nulling circuit.

DETAILED DESCRIPTION

Figure 1:
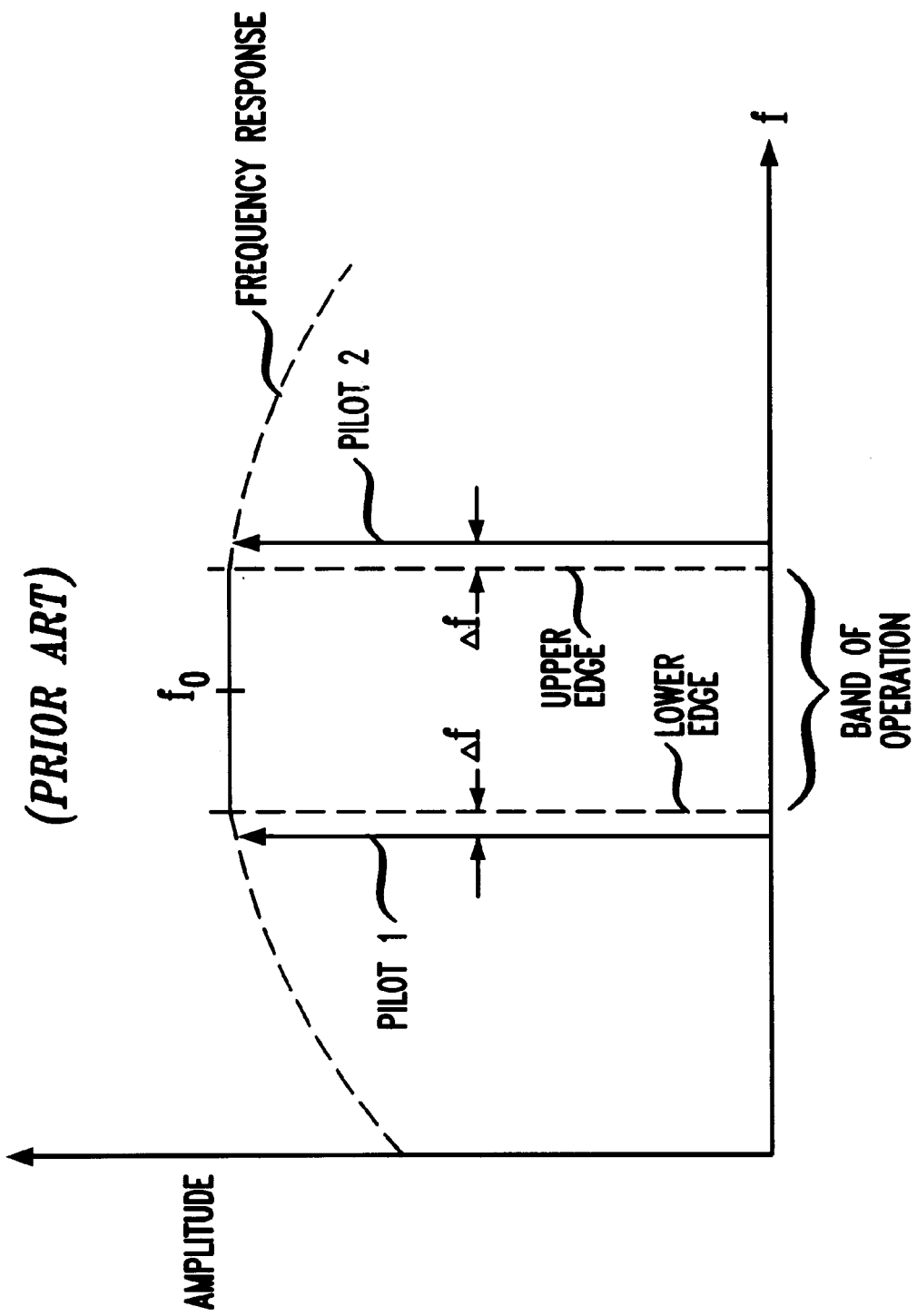
FIG. 1 shows an example frequency response curve of an RF amplifier showing the frequency within which the amplifier is operating.
Figure 2:
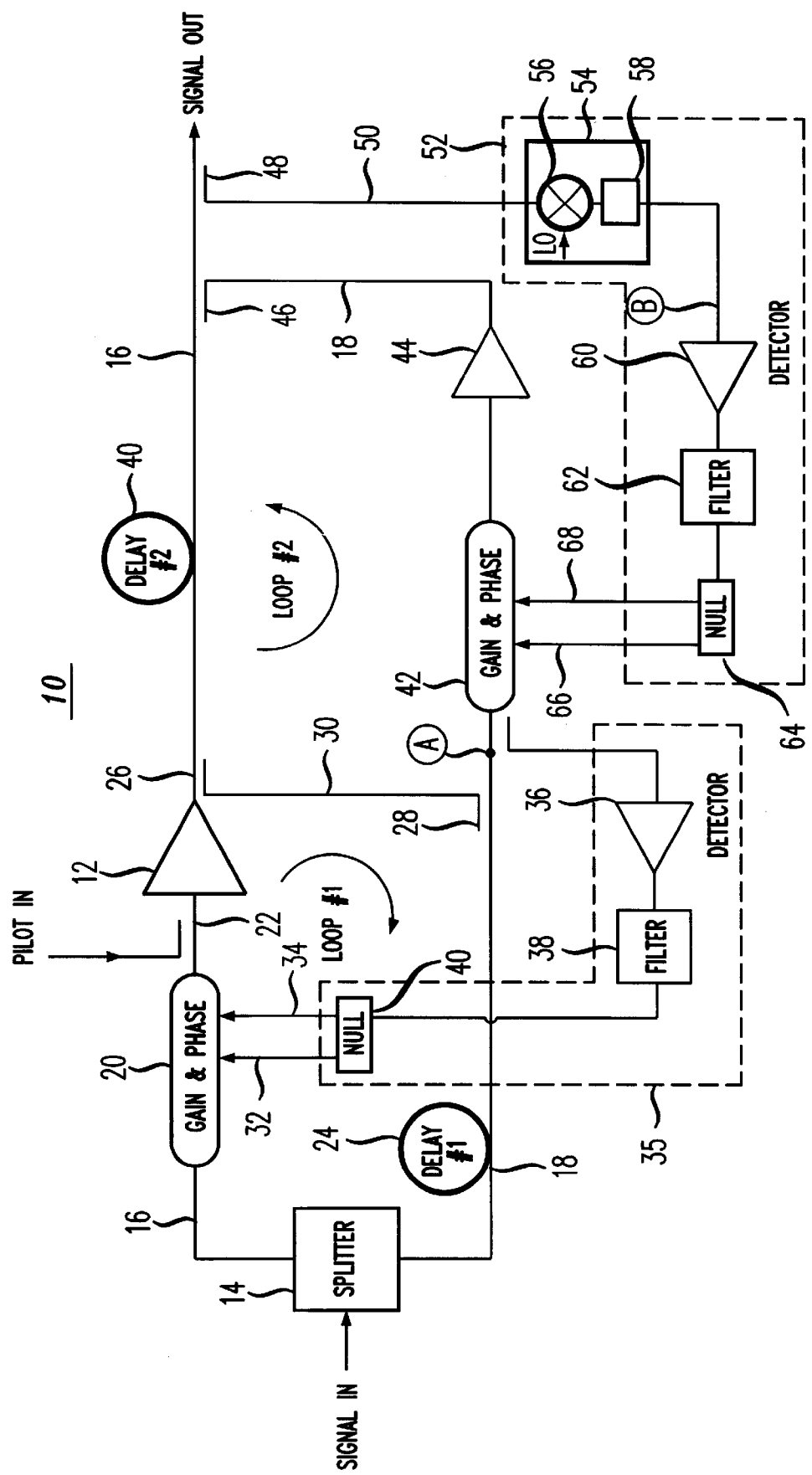
FIG. 2 is a block diagram of a feed forward distortion reduction system used for RF amplifiers.
Figure 3:
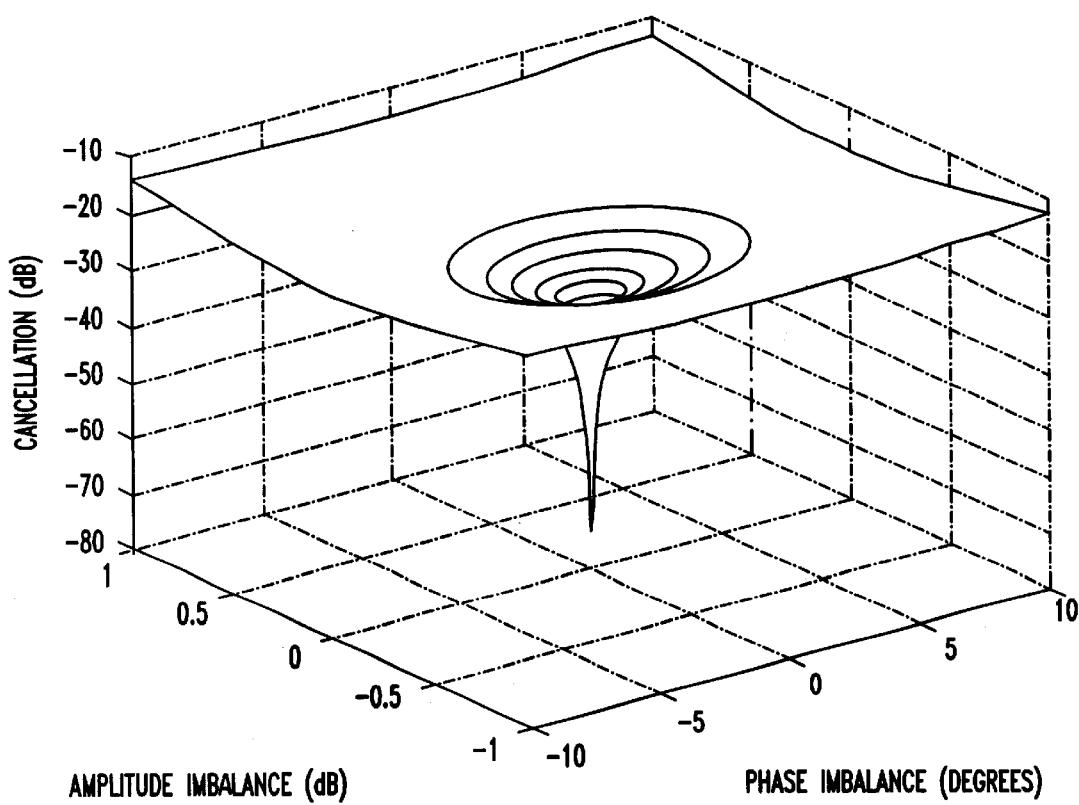
FIG. 3 shows a graph of cancellation error as a function of amplitude and phase mismatch between the combining signals.
Figure 4:
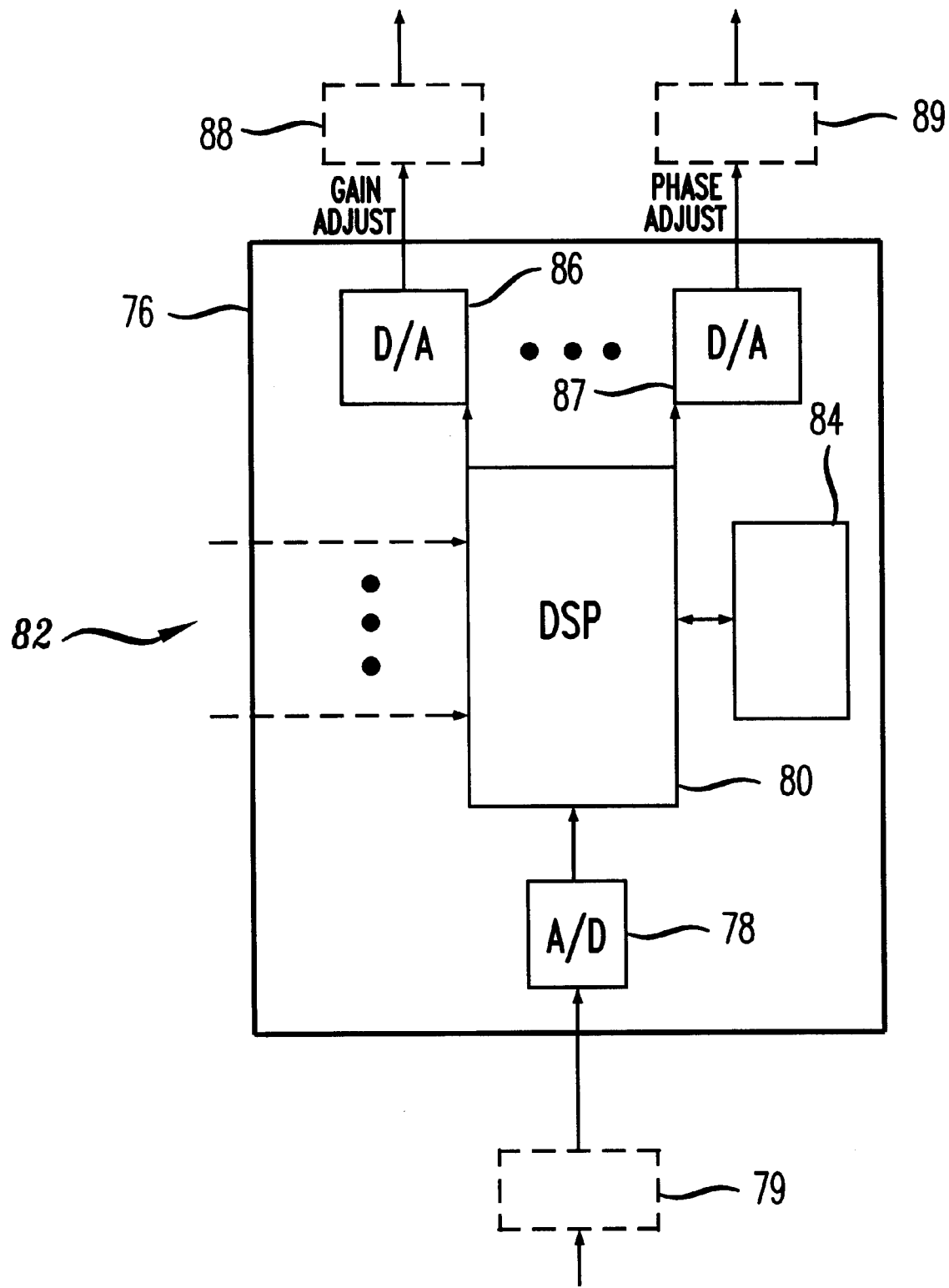
FIG. 4 shows a block diagram of an adaptive gain and/or phase control system according to the principles of the present invention.

An illustrative embodiment of an adaptive gain and/or phase adjustment control system according to the principles of the present invention is described below in a feed forward distortion reduction system. FIG. 4 shows a general block diagram of an adaptive gain and phase control circuitry 76 which receives an error signal representing the cancellation error for combining signals. Depending on the embodiment, the adaptive gain and phase adjustment system 76 can replace the nulling circuit 40 or 64 in the feed forward arrangement 10 (FIG. 2). The adaptive gain and phase adjustment circuitry 76 reduces the error signal by providing the phase and/or gain adjustment control signals to make relative gain and/or phase adjustments between combining signals to improve the error cancellation of the combining signals. To improve the error cancellation and/or the convergence rate, the adaptive phase and gain adjustment circuitry 76 adapts the adjustment resolution. The gain and/or phase control circuitry 76 can adapt the adjustment resolution by changing the relationship between an error signal and the resulting adjustment value or establishing a nonlinear relationship between the error signal and the resulting adjustment value. For example, the phase and/or gain control circuitry 76 can adapt the gain and/or phase adjustment resolution by changing the step-size or adjustment factor used to calculate the gain and/or phase adjustment values as a function of the error signal, previous error signal(s) and/or other system parameter(s).

Since the location of the null in the gain-phase plane is not stationary in time, the adaptive adjustment system enhances the performance of the system under control upon changes in system operating parameters, such as temperature, input power, amplifier bias. For example, if the error signal is large, the adjustment resolution is made coarser, for example by increasing the step size, to improve the convergence rate. If the error signal is small, the adjustment resolution is increased, for example by decreasing the step size, to further reduce the error signal. Other embodiments are possible which use the same and/or other system parameters, such as temperature, age, supply voltage, bias voltage, and/or input signal power, to determine the adjustment resolution for the gain and/or phase control circuitry 76. Additionally, embodiments can use previous system parameters such as previous error signal powers and/or previous input powers to adjust the adjustment resolution.

In the embodiment of FIG. 4, the error signal is analog-to-digitally converted by analog to digital (A/D) converter 78. Depending on the embodiment, an anti-aliasing filter 79 can be used to remove frequencies greater than ½ the A/D sampling frequency to improve detection of the signal representing the amplitude of the error signal. A DSP 80 receives the error signal and/or additional system information 82. In response to the error signal and/or other system information 82, the DSP 80 uses an adjustment resolution, for example by adjusting a step-size or adjustment factor, to provide gain and/or phase adjustment control signals attempting to reduce the error signal. The DSP 80 can use previous or cumulative information, such as error signal history, which can be stored in memory or storage 84 to determine the adjustment resolution. The storage 84 can be integrated on the DSP 80 or electrically coupled thereto. In this embodiment, the DSP 80 produces the gain and phase adjustment signals in digital form. A digital to analog (D/A) converter 86 converts the gain adjustment signals to analog form for a gain adjuster (not shown), and a digital to analog (D/A) converter 87 converts the phase adjustment signals to analog form for a phase adjuster (not shown). Reconstruction filters 88 and 89 can be used to respectively remove high frequency components from the output of the D/A's 86 and 87. The DSP 80 can also perform other control and calculations and provide additional gain and/or phase control signals (not shown) in response to a different error signal. For example, the DSP 80 can be used to provide gain and/or phase control signals 32, 34, 66 and/or 68 (FIG. 2) in response to the corresponding error signals at the input to the detection circuitry 35 and on the path 50. In other embodiments, the adaptive gain and phase adjustment control circuitry 76 can be implemented using discrete component(s), an integrated circuit(s) and/or software-driven processing circuitry.

In one embodiment, the gain and/or phase control circuitry 76 uses an error signal history, such as a weighted average or exponentially weighted average of the current and previous error signals, to continuously adapt the adjustment resolution by varying the step-size or an adjustment factor. The step size or adjustment factor K(n+1) for a gain and/or phase adjustment can be represented by the equation:

$$K(n+1)=K_S*[a^m*error(n)+a^{m-1}*error(n-1)+\ldots+a^0*error(n-m)],$$

where $K_S$ is a normalization and scaling factor used to match the input and output voltages of the control circuitry 76 to the ranges of the gain and/or phase adjustment circuitry (not shown), "a" represents a selected value (for example, 2), n represents the current sample number for an error signal based on previous gain adjustments and/or previous phase adjustments, and m represents the number of previous error signals used to determine the weighted average. $K_S$ can be determined from the following equation:

$$K_s = \frac{\text{gain}}{\sum_{i=0}^{m} a^i},$$

where the gain is set for the minimum available adjustment factor which can be accurately converted by a D/A 86 or 87.

In one embodiment, the gain and/or phase adjustment control circuitry 76 can determine a gain or phase adjustment value $V_{out}(n+1)$ by using the equation $\Delta V_{out}(n+1) = -K(n+1)*|error(n)|*sign(error(n)-error(n-1))*sign(\Delta V_{out}(n))$. If the sign of error(n)−error(n−1) is positive (meaning the previous adjustment change ($\Delta V_{out}(n)$) resulted in an increase in the error signal), then the negative sign in front of the equation flips the sign of the adjustment change $\Delta V_{out}(n+1)$ as compared to the sign of the previous voltage change $\Delta V_{out}(n)$. If the sign of error(n)−error(n−1) is negative (meaning an improvement in the error signal), the negative sign in front of the equation maintains the sign of the previous adjustment $\Delta V_{out}(n)$ which resulted in the improvement. Depending on the embodiment, the adjustment value $V_{out}(n+1)$ can be calculated each time without using the magnitude of the previous adjustment value, or the previous adjustment value is changed by an adjustment change which can be referred to as a recursive adjustment determination. For example, the gain or phase adjustment value $V_{out}(n+1)$ can be equal to $V_{out}(n)+\Delta V_{out}(n+1)$, where $V_{out}(n)$ is the previous adjustment value and $\Delta V_{out}(n+1)$ is the adjustment change. The previous adjustment value $V_{out}(n)$ can be a fixed or particular amount, an accumulation of adjustment changes or begins with a fixed amount which is changed by adjustment changes. In some embodiments, the magnitude of the adjustment factor K(n+1) is the magnitude of the adjustment change $\Delta V_{out}(n+1)$ or the magnitude of the adjustment value $V_{out}(n+1)$. The adjustment factor K(n+1) is nonlinearly related to the magnitude of the error signal error(n). As such, as the error signal decreases, the adjustment value decreases in a nonlinear fashion to reflect an increasing adjustment resolution. As the error signal increases, the adjustment value increases in a nonlinear fashion to reflect a decreasing adjustment resolution.

In other embodiments, the gain and/or phase adjustment control system 76 uses threshold(s) to adapt the adjustment resolution. For example, the control system 76 can adapt the adjustment resolution by varying the adjustment factor based on the value of the error signal or a weighted average of error signals and an adaptation threshold. For example, using the system of FIG. 2 as reference, if the error signal error (n) is less than the adaptation threshold T(n), the control system 76 can use a smaller step size, such as 0.01. If the error signal error(n) is greater than T(n)+T0 or a second threshold, then the control system 76 can use a larger step size, such as 0.05, where the offset T0 or a second threshold is used to prevent hysteresis. If the error signal is between the first and second thresholds, the control system 76 can use an intermediate step-size, such as 0.03. Alternatively, depending on the threshold comparisons, an adaptation factor or step-size can be adjusted using an adaptation factor K0. As such, if the error signal is above an adaptation threshold, the adjustment factor is increased, for example by multiplying with an adaptation factor, such as 2, so that K(n+1)=K(n)*2. If the error signal is below an adaptation threshold, the adjustment factor can be reduced, for example by dividing with the adaptation factor. Depending on the embodiment, multiple adaptation thresholds with corresponding adaptation factors(for example, stored in a lookup table), different threshold offsets and levels, incrementally changing adaptation factors or thresholds, and different or changing adaptation thresholds, factors or values can be used.

In other embodiments, the previous error signal(s) or a function of the previous error signal(s), such as an error history $H(n)=a^m*error(n)+a^{m-1}*error(n-1)+\ldots+a^0*error(n-m)$, can be compared to the adaptation threshold to determine the adjustment factor. For example, if $H(n)*K_S$ is greater than the first adaptation threshold, the adjustment factor K(n+1) can be increased, for example using an adaptation factor or value. In one embodiment, if $H(n)*K_S$ is less than an adaptation threshold T(n), then K(n+1)=K(n)/K0, where K0 is an adaptation factor equal to 2 and K(n) is the current adjustment factor. If $H(n)*K_S$ is greater than T(n)+T0 or a second adaptation threshold, then K(n+1)=K(n)*K0, where the offset value T0 or the second threshold is used to prevent hysteresis. Depending on the embodiment, the threshold offset can change depending on the threshold level. Additional threshold levels and/or different adaptation factors or values can be used to increase or decrease or further increase or decrease the adjustment resolution. Alternatively, the comparison an adaptation threshold(s) could be performed with or based on windows of previous error signals which are disjoint or overlap in time, for example the difference between two windows or the result of a function involving two windows could be compared with an adaptation threshold or otherwise used to determine an adjustment resolution, factor or value, such as $\Delta H=H(n)-H(x)$ where H(n) represents an error history value based on a set of the last n error signals and H(x) represents an error history value based on a set of x error signals which are disjoint or overlap with the set of the last n error signals.

Depending on the embodiment, the control system 76 can adjust the adaptation threshold depending on a change in the adjustment resolution. In one embodiment, if the adaptation factor is increased, the adaptation threshold can also increase, and if the adaptation factor gets smaller, the adaptation threshold can decrease. For example, if $K(n+1) > T(n)+T0$, then $T(n+1)=T(n)*Ta$ where Ta is a threshold factor equal to 1.1. If $K(n+1)<T(n)$, then $T(n+1)=T(n)/Ta$. Depending on the embodiment, different threshold factors can be used, and the threshold factors can also change depending on the threshold level.

Figure 5A:
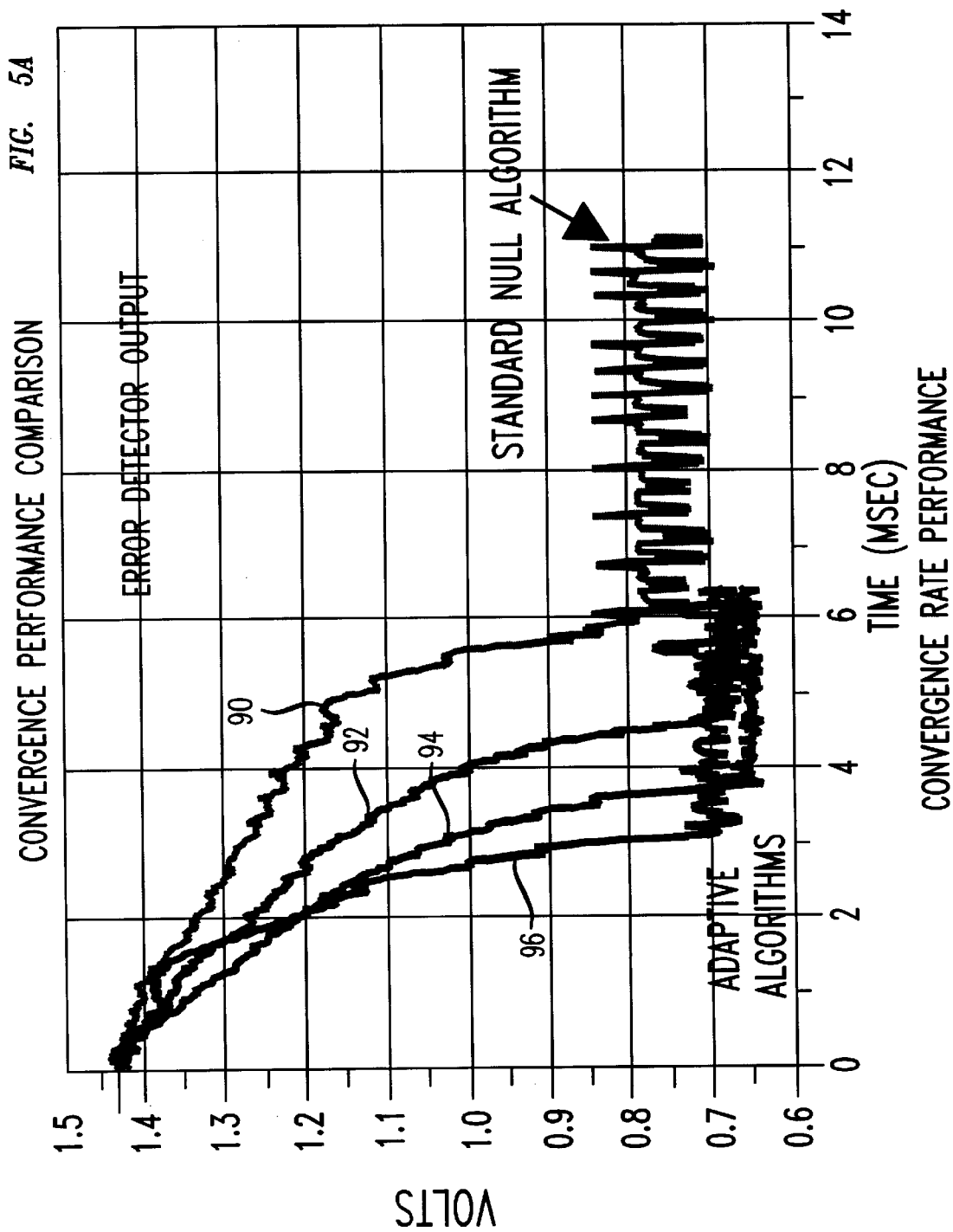

FIG. 5a shows a graph comparing the convergence rate performance between the standard fixed step-size nulling circuit using a step size of 0.0125 and different embodiments of an adaptive algorithm according to the principles of the present invention in response to an error signal resulting from combining signals which initially have a 1 dB gain differential and a 10 degree phase differential. The plot 90 reflects the error detector output in volts for the fixed step size nulling circuit. The plot 90 starts at about 1.45 V, and after 6 msec, it appears that the fixed adjustment resolution for the nulling circuit causes the error signal to bounce around the null at between 0.7 volts and 0.83 volts in the log detector 60 (FIG. 2). Plot 92 shows the error detector output for an adaptive adjustment control system with a step size $K(n+1)$ calculated using an exponentially weighted error history $H(n)$ of the last 4 error signals and with alternating series of 2 phase adjustments and 2 gain adjustments. The plot 92 starts at about 1.45 volts, and after 5 msec, the error signal drops to about 0.65–0.68 volts. Plot 94 shows the error detector output for an adaptive adjustment control system with a step size $K(n+1)$ calculated using an exponentially weighted average of the last 4 error signals with alternating series of 4 phase adjustments and 4 gain adjustments. The plot 94 starts at about 1.45 volts, and after about 4 msec, the error signal drops to between about 0.63 and 0.65 volts. Plot 96 shows the error detector output for an adaptive adjustment control system with a step size $K(n+1)$ calculated with an exponentially weighted average of the last two error signals with alternating series of 4 gain adjustments and 4 phase adjustments. The plot 96 starts at 1.45 volts, and after 3 msec, the error signal drops to about 0.68 volts with values ranging from about 0.65 to 0.75 volts.

FIG. 5b shows the results 98 of carrier cancellation using the standard fixed step-size nulling circuit described above and the results 100 of carrier cancellation using the adaptive adjustment control system using a step size calculated using an exponentially weighted average of the last 4 error signals and with alternating series of 4 gain and 4 phase adjustments. As shown, the adaptive adjustment control system achieves about 10 dB of better cancellation than the standard approach.

Thus, the adaptive gain and/or phase control system adapts the adjustment resolution to improve error cancellation and/or the convergence rate in a distortion reduction system. In doing so, the gain and/or phase control system can also provide an increased adjustment value dynamic range. Depending on the embodiment, the gain and phase adjustment resolution can be independent of each other, for example phase adjustments can be based on error signals corresponding to phase adjustments and gain adjustments depending on error signals corresponding to gain adjustments. As such, the adjustment resolution for gain or phase can be determined independently. Additionally, depending on the embodiment, the gain or phase adjustment resolution and/or values can be determined differently for gain and phase adjustments. In other embodiments, to further improve the convergence rate, single alternating gain and phase adjustments can be made whereby a gain (or phase) adjustment is performed in parallel with the detection of the previous phase (or gain) adjustment, and/or when performing a gain (or phase) adjustment, the results of the last gain (or phase) adjustment before an intervening phase (or gain) adjustment is used to determine the gain (or phase) adjustment, as described in U.S. patent application Ser. No. 09/378,009 filed concurrently with this application, assigned to the same assignee and entitled "Alternating Gain and Phase Control System and Method", herein incorporated by reference.

In addition to the embodiment described above, alternative configurations of the adaptive gain and/or phase adjustment system according to the principles of the present invention are possible which omit and/or add components and/or use variations or portions of the described system. For example, the above embodiments are described as changing the adjustment resolution in various ways. Other embodiments are possible which change the adjustment resolution in different ways, for example by adding an adaptation factor to an adjustment factor rather than multiplying or adjusting an adaptation threshold in different ways or by adding an adjustment factor, step-size or multiple thereof to obtain an adjustment value. Moreover, additional inputs, such as outputs from a temperature sensor, input power detector and/or amplifier bias detector, can be used to adjust the adjustment resolution or step-size, for example using a look-up table with the error signal and additional input(s) as inputs to provide a certain adjustment resolution or using the error signal and/or additional inputs to determine how the adjustment value is determined.

Additionally, the embodiment of the adaptive gain and/or phase control system has been described as being used with a particular feed-forward RF amplifier arrangement using a pilot signal, but the adaptive gain and/or phase control system can be used to improve the combining signals in other amplifier or electrical circuit arrangements. For example, the relative gain and/or phase adjustments can be used to increase or constructively combine the amplitude of combining signals by matching the phase rather than reducing or canceling the combining signals. Furthermore, the control system has been described as adapting the adjustment resolution using the magnitude of the error signal or an error history, but other embodiments are possible which adapt the adjustment resolution based on other information or which adapt the adjustment resolution based on the error signal or error history and other information. The adjustment resolution can be changed in various ways. In general, adapting the adjustment resolution occurs by changing the relationship or using a nonlinear relationship between the error signal and the resulting adjustment value.

Depending on the application, the gain and/or phase circuitry can be positioned in different locations and/or paths within the feed forward amplifier arrangement. For example the gain and phase adjustment circuit 20 could be located on the path 18 before the coupler 28; the gain and phase adjuster 42 could be located on the path 16 after the coupler 26; or the gain and phase adjustment circuitry 20 and 42 could be located at both locations. The control system has been described as using a software driven processing circuitry with analog and digital conversion, but other configurations can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of adapting an adjustment value which changes the relative gain or phase between combining signals, said method comprising the steps of:

changing the adjustment resolution to obtain an adjustment value based on one of at least error signal history or an adaptation threshold.

2. The method of claim 1 wherein said changing includes:

receiving an error signal resulting from said combining signals; and changing the relationship between said error signal and said adjustment value in response to the magnitude of said error signal.

3. The method of claim 1 wherein said changing includes:

receiving an error signal resulting from said combining signals; and determining said adjustment value as a nonlinear function of the magnitude of said error signal.

4. The method of claim 1 wherein said changing includes:

receiving an error signal resulting from said combining signals; and determining an adjustment factor depending on the magnitude of said error signal.

5. The method of claim 4 wherein said determining includes:

determining said adjustment factor based on an average of said error signal and previous error signals.

6. The method of claim 5 wherein said determining includes:

determining said adjustment factor based on a weighted average of said error signals.

7. The method of claim 6 wherein said determining includes:

determining said adjustment factor based on an exponentially weighted average of said error signals.

8. The method of claim 7 wherein said determining includes:

producing said adjustment value by multiplying said adjustment factor with the magnitude of said error signal.

9. The method of claim 7 wherein said determining includes:

producing said adjustment factor as said adjustment value.

10. The method of claim 1 wherein said changing includes:

receiving said error signal resulting from said combining signals;

using said error signal in a comparison with an adaptation threshold;

adapting said adjustment factor based on the results of said comparison; and determining said adjustment value using said adjustment factor.

11. The method of claim 10 wherein said adapting includes:

increasing said adjustment resolution by reducing said adjustment factor using said adaptation factor.

12. The method of claim 10 wherein said adapting includes:

decreasing said adjustment resolution by increasing said adjustment factor based on the results of said comparison.

13. The method of claim 10 wherein said using and adapting includes:

determining a value based on an average of said error signal and previous error signals;

comparing said value to said adaptation threshold; and increasing said adjustment factor if said value is above said adaptation threshold.

14. The method of claim 10 wherein said using and adapting includes:

determining a value based on an average of said error signal and previous error signals;

comparing said value to said adaptation threshold; and decreasing said adjustment factor if said value is below said adaptation threshold.

15. The method of claim 10 further including:

adapting said adaptation threshold based on the results of said comparison.

16. The method of claim 10 wherein said using includes:

determining a value as a function of the difference between at least a first window of error signals and a second window of error signals; and comparing said value to said adaptation threshold; and decreasing said adjustment factor if said adjustment factor is below said adaptation threshold.

adapting said adaptation threshold based on the results of said comparison.

17. A method of adapting an adjustment value which changes the relative gain or phase between combining signals, said method comprising the steps of:

receiving an error signal resulting from the combining signals; and determining an adjustment factor based on an average of the error signal and previous error signals.

18. A method according to claim 17, wherein the step of determining further comprises the step of determining the adjustment factor based on a weighted average of the error signals.

19. A method according to claim 18, wherein the determining step further comprises the step of determining the adjustment factor based on a weighted average of the error signals.

* * * * *